(12) United States Patent
He et al.

(10) Patent No.: US 9,293,191 B1
(45) Date of Patent: Mar. 22, 2016

(54) APPARATUSES AND METHODS FOR MULTI-MEMORY ARRAY ACCESSES

(71) Applicant: Micron Technology, Inc., Boise, ID (US)

(72) Inventors: Yuan He, Tsukuba (JP); Yoshinori Fujiwara, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/470,782

(22) Filed: Aug. 27, 2014

(51) Int. Cl.
 *G11C 11/40* (2006.01)
 *G11C 11/4096* (2006.01)
 *G11C 11/4074* (2006.01)
 *G11C 11/4091* (2006.01)
 *G11C 11/409* (2006.01)

(52) U.S. Cl.
 CPC ........ *G11C 11/4096* (2013.01); *G11C 11/4074* (2013.01); *G11C 11/4091* (2013.01); *G11C 11/409* (2013.01)

(58) Field of Classification Search
 CPC ...... G11C 7/10; G11C 7/1009; G11C 7/1078; G11C 7/1096; G11C 11/409; G11C 11/4091; G11C 11/4096; G11C 11/4074

USPC ............. 365/189.02, 189.14, 189.15, 189.16, 365/189.17, 190, 191, 230.03
See application file for complete search history.

(56) References Cited

U.S. PATENT DOCUMENTS

| | | | | |
|---|---|---|---|---|
| 5,953,259 A | * | 9/1999 | Yoon et al. | 365/189.04 |
| 6,345,006 B1 | * | 2/2002 | Ingalls et al. | 365/205 |

* cited by examiner

*Primary Examiner* — Tan T. Nguyen
(74) *Attorney, Agent, or Firm* — Dorsey & Whitney LLP (57) ABSTRACT

Methods and apparatuses are disclosed for multi-memory array access. One example apparatus includes a pair of input/output lines, and a first array coupled to the pair of input/output lines. The first array is configured to provide data to and receive data from the pair of input/output lines. The example apparatus further includes an access block coupled to the pair of input/output lines. The access block is configured to access a second array responsive to memory access control signals directed to the second array. The access block is configured provide data between the second array and the pair of main input/output lines responsive to the access of the second array.

25 Claims, 5 Drawing Sheets

Fig. 5

APPARATUSES AND METHODS FOR MULTI-MEMORY ARRAY ACCESSES

BACKGROUND OF THE DISCLOSURE

In dynamic random-access memory (DRAM), die architecture may be changed to fit more memory into a smaller area. Some methods include re-orienting arrays in a die to achieve a layout that increases a number of arrays. However, because each array needs to receive control signals and to receive and provide data during memory access operations, the signal lines for these control signals and data may end up running through space occupied by another memory array, which may require an increase in die size to fit all required signal lines. Further, including independent access blocks for each array increases complexity, die size, and array access time. Lastly, because the signal lines run through (or above or below) other memory arrays, the signal lines become longer. The longer signal lines may increase a total resistance along the signal line, and may increase an amount of time for a memory operation beyond a desired maximum, for example, during a fast column to column decode cycle.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
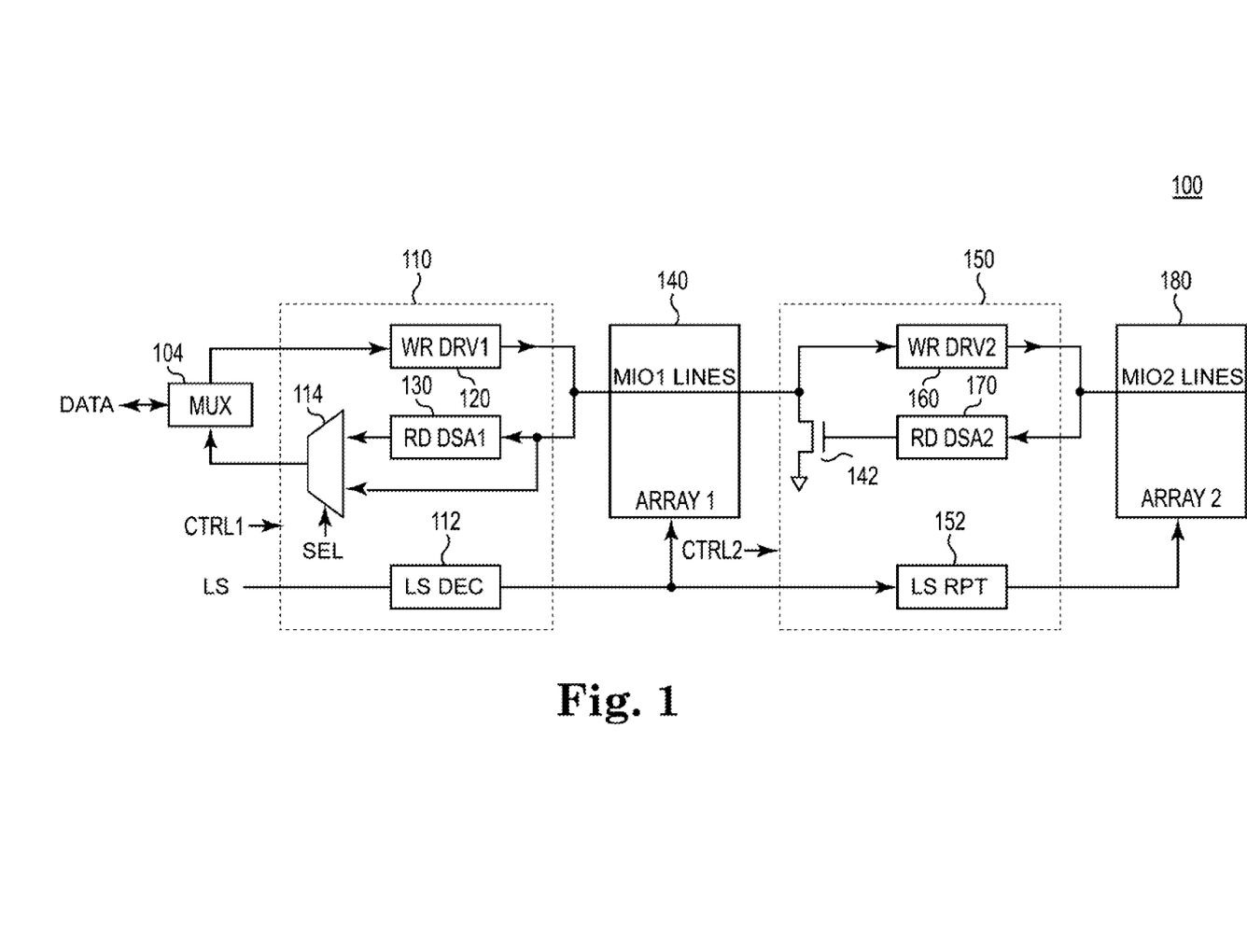
FIG. 1 is a block diagram of an apparatus including dual memory arrays and dual access blocks according to an embodiment of the disclosure.

FIG. 1 illustrates an apparatus 100 including dual memory arrays 140 and 180 and dual access blocks 110 and 150 according to an embodiment of the disclosure. As used herein, apparatus may refer to, for example, an integrated circuit, a memory device, a memory system, an electronic device or system, a smart phone, a tablet, a computer, a server, etc. The first access block 110 may be coupled to the first array 140 and the second access block 150 may be coupled between the first array 140 and the second array 180. The first access block 110 and the second access block 150 may share use of the main input/output MIO1 lines of the first array 140 for communicating data to and from the second array 180 based on a memory access associated with the second array 180, which may reduce space as compared with using separate signal lines to communicate data to and from the second array 180. In some embodiments, an MIO1 line of the first array 140 includes a pair of input/output lines, with each line of the pair providing data that is complementary to the other line. The first array 140 and the second array 180 may include an array of memory cells. The memory cells may be non-volatile memory cells, volatile memory cells, or other types of memory cells. In some examples, the apparatus 100 may be an 8 Gb memory device.

The first access block 110 may include a first write driver 120 configured to provide write data on the MIO1 lines of the first array 140 responsive to control signals CTRL1. The write data may be provided to the first write driver 120 via the data multiplexer 104. In some examples, the first write driver 120 may be configured to provide write data that is directed to the second array 180 to the second access block 150 via the MIO1 lines of the first array 140. The first access block 110 may further include a first read sense amplifier 130 configured to receive data read from the first array 140 via the MIO1 lines of the first array 140 responsive to the CTRL1 signals. The first read sense amplifier 130 may provide the sensed data from MIO1 lines to a first input of a multiplexer 114 of the first write driver 120. A second input of the multiplexer 114 may be coupled directly to MIO1 lines of the first array 140 to receive sensed data from the second array 180 via the second access block 150. The multiplexer 114 may provide one of the sensed data from the first array 140 (provided by the first read sense amplifier 130) or the sensed data from the second array 180 (provided by the second access block 150) to the data multiplexer 104 based on a selection signal SEL. The SEL signal may indicate which of the first array 140 or the second array 180 is being read. In some embodiments, the SEL signal may be derived from the CTRL1 signals and/or the CTRL2 signals.

The first access block 110 may further include a line select decoder 112 configured to receive a line select signal LS and provide a decoded line select signal (e.g., column or row select signal) to the first array 140. The line select signal LS may indicate which line or lines (e.g., column or row) of memory cells of the first array 140 or second array 180 is to be accessed.

The second access block 150 may include a second write driver 160 configured to provide write data on MIO2 lines of the second array 180 responsive to control signals CTRL2. The CTRL1 and CTRL2 signals may be provided by a control circuit (not shown) based on memory commands received via a memory controller (not shown). The second write driver 160 may retrieve the write data from the MIO1 lines of the first array 140. The second access block 150 may further include a second read sense amplifier 170 configured to sense data read from the second array 180 via the MIO2 lines of the second array 180 responsive to the CTRL2 signals. The second read sense amplifier 170 may provide a sensed read data signal to a gate of a read transistor 142 based on the sensed read data. The read transistor 142 may include a source coupled to an MIO1 line and a drain coupled to a reference voltage. Based on a value of the sensed read data signal having a logical high value, the read transistor 142 may couple the MIO1 line to the reference voltage indicating a logical low value. Otherwise, the MIO1 line may remain at a logical high value. In some embodiments, an MIO2 line of the second array 180 includes a pair of input/output lines, with each line of the pair providing data that is complementary to the other line.

The second access block 150 may further include a line select repeater 152 configured to receive the decoded line select signal from the line select decoder 112 and may repeat the decoded line select signal to the second array 180. In some examples, the first access block 110 and the second access block 150 are each column access blocks.

In operation, one or both of the MIO1 and MIO2 lines may be precharged to a precharge voltage prior to a memory access operation. For example, if the memory access operation is directed to the first array 140, the MIO1 lines may be precharged. Further, if the memory access operation is directed to the second array 180, the MIO1 and MIO2 lines may be precharged. During a write operation, the first write driver 120 may receive write data from the data multiplexer 104 and may receive write control signals via the CTRL1 signals. The data multiplexer 104 may receive the write data from a memory controller, in some examples. Further, the line select decoder 112 may receive a line select signal and provide a decoded line select signal. Responsive to receiving the write control signals, the first write driver 120 may provide the write data received from the data multiplexer 104 on the MIO1 lines of the first array 140. If the write data is directed to memory cells of the first array 140, the write data may be programmed into the selected memory cells of the first array 140 responsive to the line select signal LS. If the write data is directed to the second array 180, the second write driver 160 may receive the write data via the MIO1 lines and provide the write data on the MIO2 lines to the second array 180 responsive to the write control signals via the CTRL2 signals received at the second access block 150. The line select repeater 152 may also receive the decoded line select signal from the line select decoder 112 and repeat the decoded line select signal to the second array 180. The write data may be programmed into memory cells of the second array 180 responsive to the repeated decoded line select signal from the line select repeater 152.

During a read operation associated with the first array 140, the first access block 110 may receive read control signals via the CTRL1 signals. Responsive to the read control signals, the first array 140 may provide the data on the MIO1 lines, and the first read sense amplifier 130 may sense the data on the MIO1 lines. The first read sense amplifier 130 may provide the sensed read data to the multiplexer 114. The SEL signal may be derived from the CTRL1 signals and/or the CTRL2 signals. Responsive to the SEL signal having a first value, the multiplexer 114 may provide the sensed read data received from the first read sense amplifier 130 to the data multiplexer 104. The data multiplexer 104 may provide the sensed read data to a memory controller, in some examples.

During a read operation associated with the second array 180, the second access block 150 may receive read control signals via the CTRL2 signals. Responsive to the read control signals, the second array 180 may provide the data on the MIO2 lines, and the second read sense amplifier 170 may sense the data on the MIO2 lines. The second read sense amplifier 170 may provide a signal having a value indicative of the sensed data from the second array 180 to a gate of the read transistor 142. The read transistor 142 may cause the MIO1 line coupled to the read transistor 142 to have a value indicative of the sensed data from the second array 180 based on the signal received at the gate of the read transistor 142 from the second read sense amplifier 170. For example, if the signal received from the second read sense amplifier 170 is a first logical value (e.g., a logical high value), the read transistor 142 may be enabled, and the MIO1 line may be coupled to the reference voltage to have a second logical level (e.g., a logical low value). Further, if the signal received from the second read sense amplifier 170 is a second logical value, the read transistor 142 may not be enabled, and the MIO1 line may maintain the precharge voltage set prior to the read operation to have a first logical level. The MIO1 line may be coupled to a second input of the multiplexer 114. Responsive to the SEL signal having a second value, the multiplexer 114 may provide the sensed read data received from the second array 180 via the MIO1 line to the data multiplexer 104. The value of the SEL signal may be derived from the CTRL1 and/or the CTRL2 signals received at the first access block 110 or the second access block 150, respectively, for example.

In some examples, the line select signal LS may be propagated along a conductor that is narrower than other conductors, which leads to higher resistance and greater signal degradation as the line select signal propagates. The signal degradation may increase an amount of time necessary for circuitry receiving the line select signal to fully toggle. The line select repeater 152 may repeat the decoded line select signal to improve the signal integrity and allow fast column-to-column tCCD operation. Further, the first access block 110 and the second access block 150 sharing the MIO lines may reduce a number of MIO signal lines needed to communicate with both the first array 140 and the second array 180.

Figure 2:
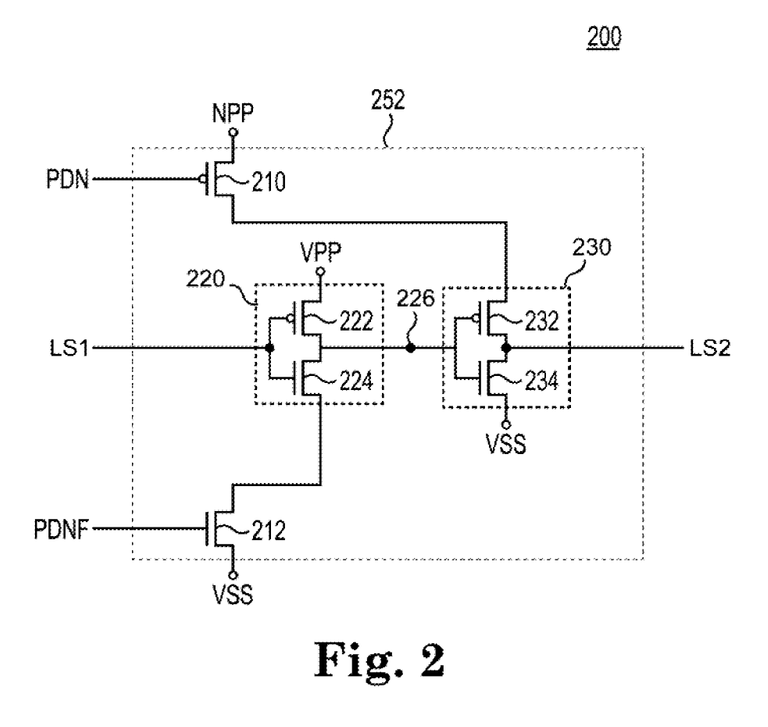
FIG. 2 is a schematic diagram of a line select repeater according to an embodiment of the disclosure.

FIG. 2 illustrates an apparatus 200 including a line select repeater 252 according to an embodiment of the disclosure. The line select repeater 252 may be implemented in the line select repeater 152 of FIG. 1. The line select repeater 252 may repeat an input line select signal LS1 and provide the repeated line select signal LS2 at an output. The line select repeater 252 may include a first inverter 220 coupled in series with a second inverter 230. The first inverter 220 may receive the LS1 signal at an input and the second inverter 230 may provide the LS2 signal at an output. The LS2 signal may have a same relative polarity as the LS1 signal.

The first inverter 220 may include a transistor 222 and a transistor 224 coupled in series. The first inverter 220 may be configured to receive the LS1 signal and to provide an output signal a node 226. The output signal may have a complementary polarity relative to the LS1 signal. The second inverter 230 may include a transistor 232 and a transistor 234. The second inverter 230 may receive the output signal from the node 226 and provide the LS2 signal at an output that is complementary relative to the input signal. Thus, the LS1 signal and the LS2 signals may have the same relative polarity.

The line select repeater 252 may further include a first power down transistor 210 and a second power down transistor 212. The first power down transistor 210 may receive a power down signal PDN and the second power down transistor 212 may receive an inverted power down signal PDNF. The first power down transistor 210 may be coupled to a source of the transistor 232 and the second power down transistor 212 may be coupled to a source of the transistor 224. Responsive to the PDN and the PDNF signals, the first power down transistor 210 and second power down transistor 212, respectively, may disable the line select repeater 252 during a power down scenario or during a first array access. The transistors 210, 222, and 232 may be p-type transistors, and the transistors 212, 224, and 234 may be n-type transistors.

Figure 3:
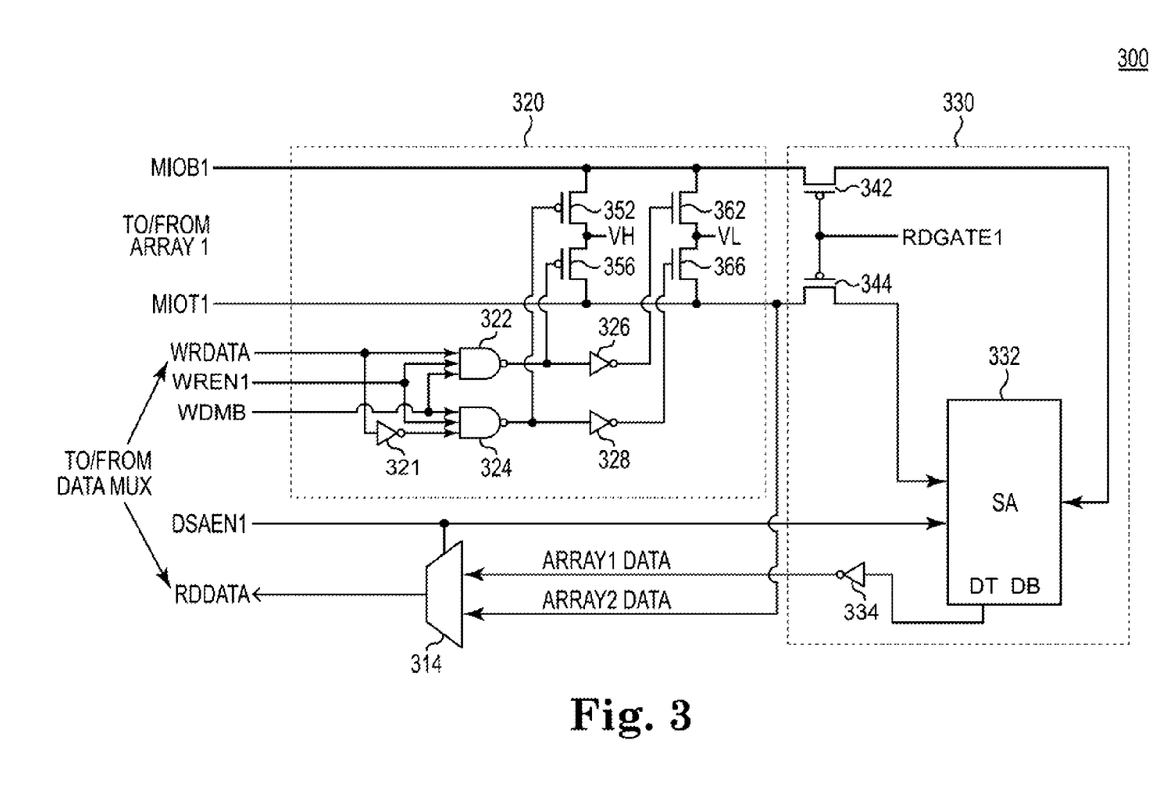
FIG. 3 is a schematic diagram of a first access block according to an embodiment of the disclosure.

FIG. 3 illustrates a first access block 300 according to an embodiment of the disclosure. The first access block 300 may be implemented in the first access block 110 of FIG. 1. The first access block 300 may include a first write driver 320 and a first read sense amplifier 330. The first write driver 320 may receive write control signals and write data, and may provide the write data to MIO1 lines based on the write control signals. The MIO1 lines are illustrated in FIG. 3 as including a MIOT1 line and a MIOB1 line. The first read sense amplifier 330 may receive read control signals, and may sense read data from the MIOT/B1 lines based on the read control signals. The MIOT1 and MIOB1 lines may be complementary I/O lines that provide data to and retrieve data from a memory array, such as the first array 140 of FIG. 1.

The first write driver 320 may include a first NAND gate 322 that is configured to receive write data WRDATA, a first write access enable signal WREN1, and a write data mask signal WDM. In parallel with the first NAND gate 322, the first write driver 320 may further include a second NAND gate 324 that is configured to receive inverted WRDATA (via inverter 321), the WREN1 signal, and the WDM signal WDM. The WREN1 and WDM signals may be included in the CTRL1 signals (e.g., the write control signals) of FIG. 1. The first write driver 320 may further include a VH drive transistor 352 and a VH drive transistor 356 coupled in series between the MIOT1 line and the MIOB1 line, and a VL drive transistor 362 and a VL drive transistor 366 coupled in series between the MIOT1 line and the MIOB1 lines. A gate of the VH drive transistor 352 may be coupled to an output of the second NAND gate 324, and a gate of the VH drive transistor 356 may be coupled to an output of the first NAND gate 322. Further, a gate of the VL drive transistor 362 may be coupled in an inverted output (via the inverter 326) of the first NAND gate 322 and a gate of the VL drive transistor 366 may be coupled in an inverted output (via the inverter 328) of the second NAND gate 324. A node between the VH drive transistor 352 and the VH drive transistor 356 may be coupled to a VH voltage source, and a node between the VL drive transistor 362 and VL drive transistor 366 may be coupled to a VL voltage source. Thus, responsive to write control signals, the VH drive transistor 352 and the VH drive transistor 356 may couple the MIOT1 line or the MIOB1 line to a VH voltage, and the VL drive transistor 362 and the VL drive transistor 366 may couple the MIOT1 line or the MIOB1 line to a VL voltage. The VH drive transistor 352 and the VH drive transistor 356 may be p-type transistors, and the VL drive transistor 362 and a VL drive transistor 366 may be n-type transistors.

The first read sense amplifier 330 may include a sense amplifier 332 that is configured to sense data from the MIOT1 line and the MIOB1 line responsive to a sense amplifier enable signal DSAEN1. The first read sense amplifier 330 may further include a gate transistor 342 coupled between the MIOB1 line and the sense amplifier 332 that is configured to couple the MIOB1 line to the sense amplifier 332. The first read sense amplifier 330 may further include a gate transistor 344 coupled between the MIOT1 line and the sense amplifier 332 that is configured to couple the MIOT1 line to the sense amplifier 332. Both the gate transistor 342 and the gate transistor 344 may be controlled via a first read gate signal RDGATE1. The gate transistors 342 and 344 may be p-type transistors. The sense amplifier 332 may provide, via an inverter 334, first read data ARRAY1 DATA (e.g., from a first memory array, such as the first array 140 of FIG. 1) to a first input of a multiplexer 314. The multiplexer 314 may also receive second read data ARRAY2 DATA (e.g., from a second memory array, such as the second array 180 of FIG. 1) at a second input via the MIOT1 line. The multiplexer 314 may provide one of the ARRAY1 DATA or the ARRAY2 DATA as read data RDDATA at an output based on the DSAEN1 signal. In some examples, the RDDATA may be provided to a data multiplexer, such as the data multiplexer 104 of FIG. 1.

In operation, the MIOT1 and MIOB1 lines may be precharged to a precharge voltage prior to a memory operation. During a write operation, the first write driver 320 may receive the WRDATA, the WREN1 signal, and the WDM signal. The WDM signal may be used to mask unwanted data received via the WRDATA signal. Based on the WREN1 and WDM signals, the WRDATA may be provided to the MIOT1 and MIOB1 lines. For example, when the WREN1 and the WDM signals are both at a logical high value, the outputs of the first NAND gate 322 and the second NAND gate 324 may toggle based on a logical value of the WRDATA. For example, when the WRDATA has a logical high value, the output of the first NAND gate 322 may be a logical low value and the output of the second NAND gate 324 may be a logical high value. In this example, based on the logical low value at the output of the first NAND gate 322, the VH drive transistor 356 may couple the VH voltage to the MIOT1 line. Further, based on the logical high value at the output of the second NAND gate 324, the VH drive transistor 352 may electrically isolate the VH voltage from the MIOB1 line. Additionally, based on the logical high value at the output of the inverter 326, the VL drive transistor 362 may couple the VL voltage to the MIOB1 line. Based on the logical low value at the output of the inverter 328, the VL drive transistor 366 may electrically isolate the VL voltage from the MIOT1 line.

In an example where the write data has a logical low value, the output of the first NAND gate 322 is a logical high value and the output of the second NAND gate 324 is a logical low value. The VH voltage is coupled to the MIOB1 line via the VH drive transistor 352 and the VL voltage is coupled to the MIOT1 line via the VL drive transistor 366. As previously described with reference to FIG. 1, the first write driver 320 may provide the WRDATA to the MIOT1 and MIOB1 lines regardless of whether the WRDATA is directed to a first memory array or a second memory array.

The first access block 300 may be configured to provide the RDDATA at an output responsive to a read operation associated with one of a first memory array or a second memory array. During a read operation associated with a first memory array, the first read sense amplifier 330 may receive a RDGATE1 signal, and responsive to the RDGATE1 signal, the gate transistor 342 and gate transistor 344 may couple the MIOB1 and MIOT1 lines, respectively, to the sense amplifier 332. The DSAEN1 and RDGATE1 signals may be included in the CTRL1 signals (e.g., the read control signals) of FIG. 1. The sense amplifier 332 may also receive a DSAEN1 signal configured to enable the sense amplifier 332. Responsive to the DSAEN1 signal having a first value, the sense amplifier 332 may sense first memory array data on the MIOT1 and MIOB1 lines. The sense amplifier 332 may provide the data sensed from the MIOT1 line to the multiplexer 314 via the inverter 334 as ARRAY1 DATA. Responsive to the DSAEN1 signal having the first value, the multiplexer 314 may provide the ARRAY1 DATA at an output as RDDATA.

During a read operation associated with a second memory array, the multiplexer 314 may receive ARRAY2 DATA from the MIOT1 line. The RDGATE1 signal may disable the gate transistor 342 and the gate transistor 344, and the DSAEN1 signal may have a second logical value, disabling the sense amplifier 332. The multiplexer 314 may provide the ARRAY2 DATA responsive to the DSAEN1 signal having the second logical value.

By sharing the MIOT1 and MIOB1 lines to provide write data to and receive read data from more than one memory array, a single signal line can be used to generate MIO lines for multiple arrays, which may reduce size as compared to running separate MIO signal lines for each array. The NAND logic used in the first write driver 320 may be accomplished using other logic. Further, the types of transistors used in the first write driver 320 and the first read sense amplifier 330 may be different than depicted, and signal polarities may be manipulated accordingly to provide data onto and retrieve data from the MIOT1 and MIOB1 lines.

Figure 4:
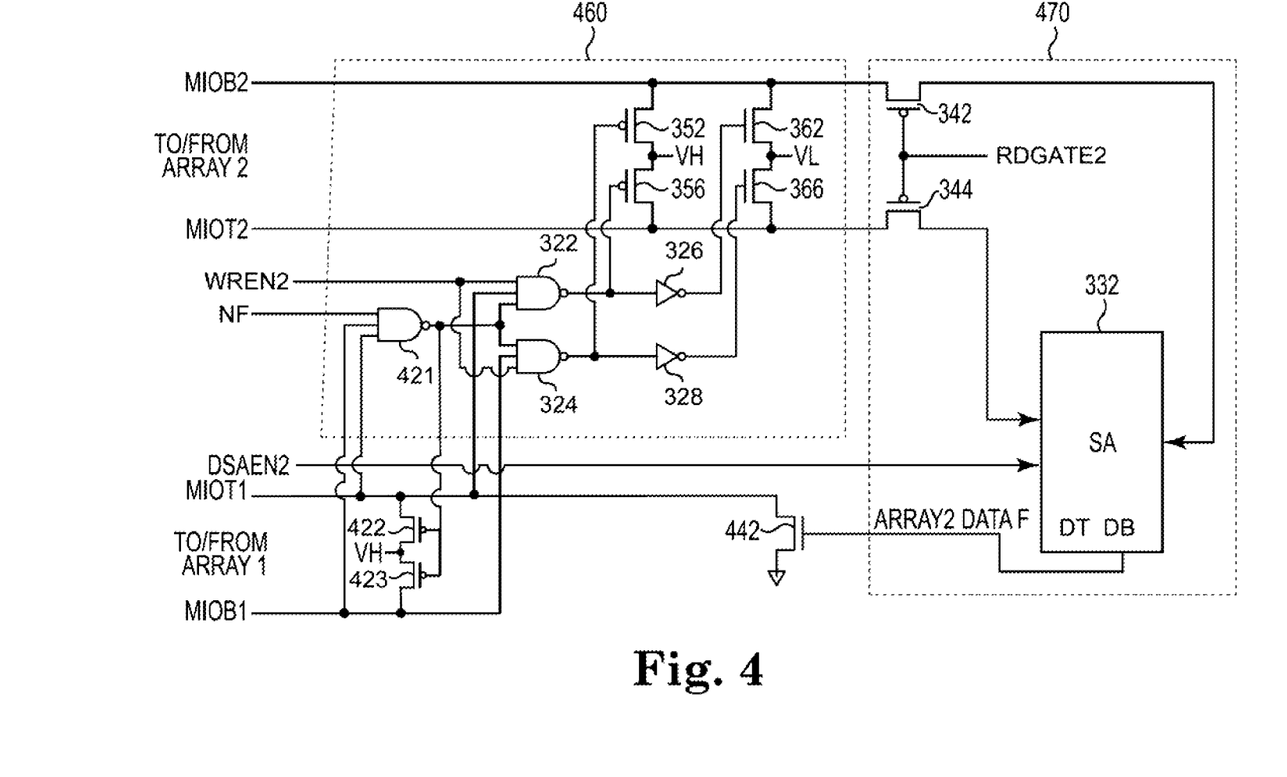
FIG. 4 is a schematic diagram of a second access block according to an embodiment of the disclosure.

FIG. 4 illustrates a second access block 400 according to an embodiment of the disclosure. The second access block 400 may be implemented in the second access block 150 of FIG. 1. The second access block 400 may include a second write driver 460 and a second read amplifier 470. The second write driver 460 may receive write control signals and write data via MIOT1 and MIOB1 lines, and may provide the write data to MIOT/B2 lines based on the write control signals. The second read sense amplifier 470 may receive read control signals, and may sense read data from the MIOT/B2 lines based on the read control signals and provide the read data on the MIOT1 line. The MIOT2 and MIOB2 lines may be complementary I/O lines that provide data to and retrieve data from a memory array, such as the second array 180 of FIG. 1. The second access block 400 includes elements that have been previously described with respect to the first access block 300 of FIG. 3. Those elements have been shown in FIG. 4 using the same reference numbers used in FIG. 3, and operation of common elements is as previously described. Consequently, a detailed description of the operation of these elements will not be repeated in the interest of brevity.

The second write driver 460 may receive a near or far signal NF and a second write enable signal WREN2. The NF and WREN2 signals may be included in the CTRL2 signals (e.g., the write control signals) of FIG. 1. The NF signal may indicate which memory array is being accessed (e.g., the first memory array or the second memory array). The second write driver 460 may include a mask NAND gate 421 configured to receive the NF signal and signals from each of the MIOT1 and MIOB1, and provide a derived mask signal to the first NAND gate 322, the second NAND gate 324, and gates of keeper transistors 422 and 423. The second write driver 460 may use the MIOT1, MIOB1, and NF signals to derive the derived mask signal rather than receiving the WDM signal described with reference to FIG. 3, to reduce a number of data mask lines through the first memory array. The NF signal, used in combination with the MIOT1 and MIOB1 signals may prevent the derived mask signal at the output of the mask NAND gate 421 from toggling when the MIOT1 and MIOB1 lines are toggle during a memory access operation associated with a first array, such as the first array 140 of FIG. 1, and control keeper transistors 422 and 423 to control the voltages on the MIOT1 and MIOB1 lines. The keeper transistors 422 and 423 may drive the MIOT1 and MIOB1 lines to the VH voltage when the derived mask signal has a logical low value (e.g., indicated that write data is masked). Otherwise, the keeper transistors 422 and 423 may be inactive (e.g., and the VH signal may be decoupled from the MIOT1 and MIOB1 lines) while the derived mask signal has a logical high value. The write data may be at the first NAND gate 322 and the second NAND gate 324 via a combination of the MIOT1 lines and the MIOB1 lines (e.g., the values of the MIOT1 and MIOB1 lines may be complementary). The outputs of the first NAND gate 322 and second NAND gate 324 may control the voltages coupled to the MIOT2 and MIOB2 lines via the VH drive transistor 352, VH drive transistor 356, VL drive transistor 362, and VL drive transistor 366.

The second read sense amplifier 470 may include the sense amplifier 332 that is configured to sense data from the MIOT2 line and the MIOB2 line responsive to a sense amplifier enable signal DSAEN2. The sense amplifier 332 may provide inverted second read data ARRAY2 DATA F (e.g., from a second memory array, such as the second array 180 of FIG. 1) to a gate of a read transistor 442. The read transistor 442 may be coupled between the MIOT1 line and a reference voltage source. When the ARRAY2 DATA F has a first logical value, the read transistor 442 may couple the MIOT1 line to the reference voltage source. When the ARRAY2 DATA F has a second logical value, the MIOT1 line may be decoupled from the reference voltage source.

In operation, during a write operation, the second write driver 460 may receive the write data via the MIOT1 and MIOB1 lines, the WREN2 signal, and the NF signal. The mask NAND gate 421 may provide a mask signal to the first NAND gate 322 and the second NAND gate 324 based on the MIOT1 line, the MIOB1 line, and the NF signal. The write mask signal may be used to mask unwanted data received via the WRDATA signal. When write data is not being driven on the MIOT1 and MIOB1 lines, the MIOT1 and MIOB1 lines may be held at a logical high voltage. However, during an access operation at the first access block, the MIOT1 and MIOB1 lines toggle. Thus, to prevent the mask signal from toggling when the MIOT1 and MIOB1 lines toggle, the NF signal may be included in the determination of the mask signal. The NF signal may be provided on an address line that distinguishes between the first array and the second array, such as a row address line. In one example, the NF signal may be provided on row address line number 14. The derived mask signal indicating a mask is active (e.g., a logical low value) may enable keeper transistors 422 and 423 to couple the MIOT1 and MIOB1 lines to the VH voltage. Further, the derived mask signal indicating a mask is not active (e.g., a logical high value) may disable the keeper transistors 422 and 423 from coupling the MIOT1 and MIOB1 lines to the VH voltage. Thus while being masked, the keeper transistors 422 and 423 drive the MIOT1 and MIOB1 lines to the VH voltage. However, when data is being provided to be written via the MIOT1 and MIOB1 lines and the mask is inactive, the keeper transistors 422 and 423 leave the voltages on the MIOT1 and MIOB1 lines undisturbed.

Based on the WREN2 and the derived mask signals, the write data from the MIOT1 and MIOB1 lines may be provided to the MIOT2 and MIOB2 lines. For example, when the WREN2 and the WDM signals are logical high values, the outputs of the first NAND gate 322 and the second NAND gate 324 may toggle based on a logical value of the MIOT1 line and the MIOB1 line, respectively. For example, when the MIOT1 line has a logical high value and the MIOB1 has a low logical value, the output of the first NAND gate 322 may be a logical low value and the output of the second NAND gate 324 may be a logical high value. In this example, based on the logical low value at the output of the first NAND gate 322, the VH drive transistor 356 may couple the VH voltage to the MIOT2 line. Further, based on the logical high value at the output of the second NAND gate 324, the VH drive transistor 352 may electrically isolate the VH voltage from the MIOB2 line. Additionally, based on the logical high value at the output of the inverter 326, the VL drive transistor 362 may couple the VL voltage to the MIOB2 line. Based on the logical high value at the output of the inverter 328, the VL drive transistor 366 may electrically isolate the VL voltage from the MIOT2 line. In an example where the MIOT1 has a logical low value and the MIOTB has a logical high value, the output of the first NAND gate 322 is a logical high value and the output of the second NAND gate 324 is a logical low value, and the VH voltage is coupled the MIOB2 line via the VH drive transistor 352 and the VL voltage is coupled to the MIOT2 line via the VL drive transistor 366.

During a read operation, the second read sense amplifier 470 may receive a second read gate signal RDGATE2, and responsive to the RDGATE1 signal, the gate transistor 342 and gate transistor 344 may couple the MIOB2 and MIOT2 lines, respectively, to the sense amplifier 332. The DSAEN2 and RDGATE1 signals may be included in the CTRL2 signals (e.g., the read control signals) of FIG. 1. The sense amplifier 332 may also receive a DSAEN2 signal configured to enable the sense amplifier 332. Responsive to the DSAEN2 signal having a first value, the sense amplifier 332 may sense ARRAY2 DATA F on the MIOT2 and MIOB2 lines. The sense amplifier 332 may provide the ARRAY2 DATA F sensed from the MIOT2 line to the gate of the read transistor 442. When the ARRAY2 DATA F has a logical high value, the MIOT1 line may be coupled to the reference voltage source. When the ARRAY2 DATA F has a logical low value, the MIOT1 line may be decoupled from the reference voltage source.

Thus, the first access block 300 and the second access block 400 may work together to share the MIOT1 and MIOB1 lines to provide data to and receive data from a second memory array, which may reduce size as compared to running independent MIO signal lines for the second memory array. It will be appreciated that the NAND logic used in the second write driver 460 may be accomplished using alternative logic. Further, the types of transistors used in the second access block 400 may be different than depicted, and signal polarities may be manipulated accordingly to achieve a similar result in providing data to and receiving data from the MIOT1 and MIOB1 lines.

Figure 5:
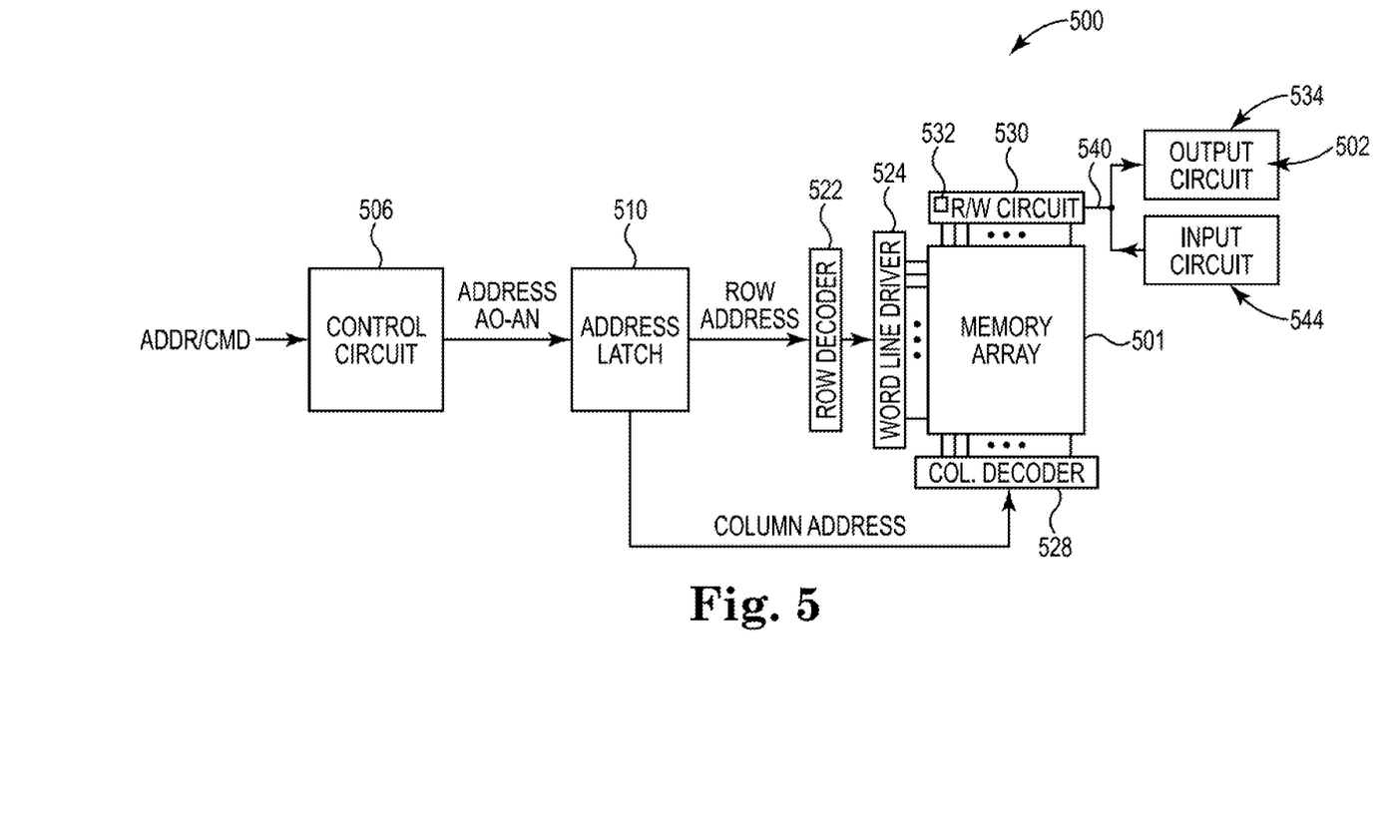
FIG. 5 is a block diagram of a memory according to an embodiment of the disclosure.

FIG. 5 illustrates a memory 500 according to an embodiment of the present disclosure. The memory 500 includes an array 501 of memory cells, which may be, for example, volatile memory cells (e.g., DRAM memory cells, SRAM memory cells), non-volatile memory cells (e.g., flash memory cells), or some other types of memory cells. The array 501 of memory cells may include the first array 140 and/or the second array 180 of FIG. 1. The memory 500 includes a control circuit 506 that receives memory commands and addresses through an ADDR/CMD bus. The control circuit 506 provides control signals, based on the commands received through the ADDR/CMD bus. The control circuit 506 also provides row and column addresses to the memory 500 through an address bus and an address latch 510. The address latch then outputs separate column addresses and separate row addresses.

The row and column addresses are provided by the address latch 510 to a row address decoder 522 and a column address decoder 528, respectively. The column address decoder 528 selects digit lines extending through the array 501 associated with respective column addresses. The row address decoder 522 is connected to word line driver 524 that activates respective rows of memory cells in the array 501 associated with received row addresses. The selected data line (e.g., a digit line or digit lines) associated with a received column address are coupled to a read/write circuit 530 to provide read data to a data output circuit 534 via an input-output data bus 540. Write data are provided to the array 501 through a data input circuit 544 and the memory array read/write circuit 530. The read/write circuit 530 may include array circuitry, for example, precharge circuits and sense amplifiers, used during access of the array 501. The memory array read/write circuit 530 may include a 532 configured to provide write data to the memory array and receive read data from the memory array. The 532 may include the first access block 110 or the second access block 150 of FIG. 1, the apparatus 200 of FIG. 2, the first access block 300 of FIG. 3, and/or the second access block 400 of FIG. 4. The control circuit 506 responds to memory commands and addresses provided to the ADDR/CMD bus to perform various operations on the array 501. In particular, the control circuit 506 is used to provide internal control signals to read data from and write data to the array 501.

From the foregoing it will be appreciated that, although specific embodiments of the disclosure have been described herein for purposes of illustration, various modifications may be made without deviating from the spirit and scope of the disclosure.

Accordingly, the disclosure is not limited to the specific embodiments of the disclosure described herein.

What is claimed is:

1. An apparatus, comprising:
   a pair of input/output lines;
   a first array coupled to the pair of input/output lines, the first array configured to provide data to and receive data from the pair of input/output lines;
   an access block coupled to the pair of input/output lines, the access block configured to access a second array responsive to memory access control signals directed to the second array, wherein the access block is configured provide data between the second array and the pair of input/output lines responsive to the access of the second array, wherein the access block comprises a write driver configured to provide write data received via the pair of input/output lines to a second pair of input/output lines coupled to the second array.

2. The apparatus of claim 1, wherein the write driver comprises:
   a first NAND gate including inputs configured to receive signals from each of the pair of input/output lines and to receive a signal indicating the first or second array, the first NAND gate configured to provide a derived mask signal at an output;
   a second NAND gate configured to receive a signal from a first of the pair of input/output lines, a write enable signal, and the derived mask signal; and
   a third NAND gate configured to receive a signal from a second of the pair of input/output lines, the write enable signal, and the derived mask signal.

3. The apparatus of claim 2, wherein the write driver comprises:
   a pair of p-type transistors coupled in series between the second pair of input/output lines, wherein a gate of a first transistor of the pair of p-type transistors is coupled to an output of the second NAND gate and a gate of a second transistor of the pair of p-type transistors is coupled to an output of the third NAND gate, wherein a node between the pair of p-type transistors is coupled to a first voltage source; and
   a pair of n-type transistors coupled in series between the second pair of input/output lines, wherein a gate of a first transistor of the pair of n-type transistors is coupled to an inverted output of the third NAND gate and a gate of a second transistor of the pair of n-type transistors is coupled to an inverted output of the second NAND gate, wherein a node between the pair of n-type transistors is coupled to a second voltage source.

4. The apparatus of claim 3, wherein a voltage of the first voltage source has a greater magnitude than a voltage of the second voltage source.

5. The apparatus of claim 2, further comprising a pair of p-type transistors coupled in series between the pair of input/output lines, wherein a gate of each of the pair of p-type transistors is configured to receive the derived mask signal, wherein the pair of p-type transistors are configured to couple the pair of input/output lines to a first voltage source responsive to the derived mask signal.

6. The apparatus of claim 1, wherein the pair of input/output lines are a first pair of input/output lines, wherein the access block comprises a read sense amplifier configured to provide read data received from the second array via a second pair of input/output lines to the pair of input/output lines.

7. The apparatus of claim 6, wherein the read sense amplifier comprise a sense amplifier selectively coupled each of the second pair of input/output lines; wherein the sense amplifier is configured to sense data read from the second array based on voltages of the second pair of input/output lines.

8. The apparatus of claim 7, wherein the access block further comprises a read transistor coupled between a first of the first pair of input/output lines and a reference voltage source, wherein a gate of the read transistor is coupled to an output of the read sense amplifier, wherein the read transistor is configured to couple the first of the first pair of input/output lines to the reference voltage source based on the output of the read sense amplifier.

9. An apparatus, comprising:
a pair of input/output lines;
a first array coupled to the pair of input/output lines, the first array configured to provide data to and receive data from the pair of input/output lines;
an access block coupled to the pair of input/output lines, the access block configured to access a second array responsive to memory access control signals directed to the second array, wherein the access block is configured provide data between the second array and the pair of input/output lines responsive to the access of the second array, wherein the access block further comprises an line select repeater circuit configured to receive a line select signal and provide a repeat of the line select signal at an output.

10. The apparatus of claim 9, wherein the line select repeater circuit comprises a first inverter coupled in series with a second inverter, wherein the first inverter is configured to receive the line selected signal at an input and the second inverter is configured to provide the repeated line select signal at an output.

11. The apparatus of claim 9, wherein the line select repeater circuit further comprises:
a first power down transistor configured to selectively couple a high voltage source to the second inverter based on a power down signal; and
a second power down transistor configured to selectively couple a low voltage source to the first inverter based on the power down signal.

12. The apparatus of claim 9, wherein the line select signal is a column select signal.

13. An apparatus, comprising:
a pair of input/output lines;
a first array coupled to the pair of input/output lines, the first array configured to provide data to and receive data from the pair of input/output lines;
an access block coupled to the pair of input/output lines, the access block configured to sense data from the first array via the pair of input/output lines during a memory access operation associated with the first array, the access block configured to receive data from a second array via the pair of input/output lines during a memory access operation associated with a second array, wherein the access block comprises a multiplexer configured to provide one of the sensed data from the first array or the data from the second array based on a control signal, wherein the control signal is indicative of whether a memory access operation is associated with the first array or the second array.

14. The apparatus of claim 13, wherein the access block comprises write driver configured to provide write data to the pair of input/output lines responsive to write control signals, wherein the write data is directed to the first array or a second array.

15. The apparatus of claim 14, wherein the write driver comprises:
a first NAND gate configured to receive the write data, a write mask signal, and a write enable signal, wherein the write mask signal indicates whether the write data should be masked; and
a second NAND gate configured to receive inverted write data, the write mask signal, and the write enable signal.

16. The apparatus of claim 15, wherein the write driver comprises:
a pair of p-type transistors coupled in series between the pair of input/output lines, wherein a gate of a first transistor of the pair of p-type transistors is coupled to an output of the first NAND gate and a gate of a second transistor of the pair of p-type transistors is coupled to an output of the second NAND gate, wherein a node between the pair of p-type transistors is coupled to a first voltage source; and
a pair of n-type transistors coupled in series between the pair of input/output lines, wherein a gate of a first transistor of the pair of n-type transistors is coupled to an inverted output of the third NAND gate and a gate of a second transistor of the pair of n-type transistors is coupled to an inverted output of the second NAND gate, wherein a node between the pair of n-type transistors is coupled to a second voltage source.

17. The apparatus of claim 13, wherein the access block further comprises an line select decoder circuit configured to decode a line select signal and provide a decoded line select signal at an output.

18. The apparatus of claim 13, wherein the access block is a first access block, the apparatus further comprising a second access block coupled to the pair of input/output lines, the second access block configured to access the second array responsive to the memory access operation being directed to the second array.

19. The apparatus of claim 18, wherein the second access block is configured to retrieve data from and provide data to the pair of input/output lines responsive to the memory access operation being directed to the second array.

20. The apparatus of claim 19, wherein the first access block is configured to provide read data from the first array at an output responsive to the memory access operation being directed to the first array, wherein the first access block is further configured to provide read data from the second array at an output responsive to the memory access operation being to the second array.

21. A method, comprising:
during a memory access operation associated with a first array, providing first array data along a pair of input/output lines between a first access block and the first array;
during a memory access operation associated with a second array, providing second array data along the pair of input/output lines between a first access block and a second access block; and
during the memory access operation associated with the second array, deriving a mask signal based on the data received via the pair of input/output lines.

22. The method of claim 21, further comprising, during the memory access operation associated with the second array, providing the second array data to the second array.

23. The method of claim 21, further comprising:
decoding a line select signal at a first access block;

providing a decoded line select signal to the second access block; and providing a repeated decoded line select signal to the second array based on the decoded line select signal.

24. The method of claim 21, further comprising:

during the memory access operation associated with the first array:

sensing the first array data on the pair of input/output lines; and providing the sensed first array data to a multiplexer; and during the memory access operation associated with the second array, providing the second array data from the pair of input/output lines to the multiplexer.

25. The method of claim 21, during the memory access operation associated with the second array, providing the write data on the pair of input/output lines to the second access block.

* * * * *